(12) United States Patent
Beers et al.

(10) Patent No.: US 10,883,045 B2
(45) Date of Patent: Jan. 5, 2021

(54) PHOSPHOR MATERIALS INCLUDING FLUIDIZATION MATERIALS FOR LIGHT SOURCES

(71) Applicant: Current Lighting Solutions, LLC, East Cleveland, OH (US)

(72) Inventors: William Winder Beers, Chesterland, OH (US); Fangming Du, Northfield, OH (US); Clark David Nelson, Cleveland, OH (US)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 0 days.

(21) Appl. No.: 15/374,087

(22) Filed: Dec. 9, 2016

(65) Prior Publication Data

US 2017/0313937 A1    Nov. 2, 2017

Related U.S. Application Data

(60) Provisional application No. 62/330,401, filed on May 2, 2016.

(51) Int. Cl.
*H01L 33/56* (2010.01)
*C09K 11/61* (2006.01)
(Continued)

(52) U.S. Cl.
CPC .............. *C09K 11/617* (2013.01); *C08K 3/08* (2013.01); *C08K 3/22* (2013.01); *C08K 3/34* (2013.01);
(Continued)

(58) Field of Classification Search
CPC ...... C09K 11/617; C09K 11/025; C09D 7/14; C09D 183/04; C09D 5/22; H05B 33/20;
(Continued)

(56) References Cited

U.S. PATENT DOCUMENTS

2004/0166234 A1 *  8/2004  Chua ..................... H01L 33/50
                                                                427/64
2008/0296596 A1 * 12/2008  Setlur ................... B82Y 30/00
                                                                257/98
(Continued)

FOREIGN PATENT DOCUMENTS

WO    2015056525 A1    4/2015
WO    2015102876 A1    7/2015

OTHER PUBLICATIONS

Zhengliang Wang et al: "Synthesis of K2XF6:Mn4+ (X=Ti, Si and Ge) red Phospors for White LED Applications with Low-Concentration of HF"; Optical Materials, Sep. 24, 2015.
(Continued)

*Primary Examiner* — Bilkis Jahan
(74) *Attorney, Agent, or Firm* — Buckley, Maschoff & Talwalkar LLC

(57) ABSTRACT

A method includes obtaining a potassium hexafluorosilicate (PFS)-based powder, obtaining a fluidization material, and mixing the PFS-based powder with the fluidization material to form a PFS-based mixture. The PFS-based mixture is configured to be mixed with a resinous material to form a flowing phosphor blend configured to be placed onto a light source to form a phosphor on the light source.

15 Claims, 5 Drawing Sheets

(51) Int. Cl.
- *C09D 7/80* (2018.01)
- *H05B 33/14* (2006.01)
- *H05B 33/20* (2006.01)
- *C08K 3/08* (2006.01)
- *C08K 3/22* (2006.01)
- *C08K 3/34* (2006.01)
- *C09D 5/22* (2006.01)
- *C09D 183/04* (2006.01)
- *C09K 11/02* (2006.01)
- *H01L 33/50* (2010.01)

(52) U.S. Cl.
CPC ............... *C09D 5/22* (2013.01); *C09D 7/80* (2018.01); *C09D 183/04* (2013.01); *C09K 11/025* (2013.01); *H01L 33/502* (2013.01); *H01L 33/56* (2013.01); *H05B 33/14* (2013.01); *H05B 33/20* (2013.01); *C08K 2003/2227* (2013.01); *H01L 2933/005* (2013.01); *H01L 2933/0041* (2013.01)

(58) Field of Classification Search
CPC ............. H05B 33/14; H01L 2933/005; H01L 2933/00; H01L 33/56; H01L 33/502; C08K 2003/2227; C08K 3/22; C08K 3/34; C08K 3/08

See application file for complete search history.

(56) References Cited

U.S. PATENT DOCUMENTS

| | | | |
|---|---|---|---|
| 2011/0001151 A1 | 1/2011 | Le Toquin | |
| 2011/0315956 A1* | 12/2011 | Tischler | H01L 33/08 257/13 |
| 2013/0020601 A1* | 1/2013 | Daicho | H05B 33/10 257/98 |
| 2013/0164869 A1* | 6/2013 | Ebe | C08K 5/56 438/27 |
| 2014/0231850 A1* | 8/2014 | Tischler | H01L 33/54 257/98 |
| 2015/0001557 A1* | 1/2015 | Yoon | H01L 25/0753 257/88 |
| 2015/0048399 A1* | 2/2015 | Weiler | H01L 33/502 257/98 |
| 2015/0076406 A1* | 3/2015 | Zhou | C09K 11/616 252/301.4 F |
| 2015/0123153 A1* | 5/2015 | Setlur | H01L 33/504 257/98 |
| 2016/0347998 A1* | 12/2016 | Kaneyoshi | C09K 11/616 |
| 2018/0364553 A1* | 12/2018 | Chou | H01L 33/502 |

OTHER PUBLICATIONS

International Search Report issued in connection with corresponding Application No. PCT/US2017/029534 dated Jul. 13, 2017.

* cited by examiner

PHOSPHOR MATERIALS INCLUDING FLUIDIZATION MATERIALS FOR LIGHT SOURCES

CROSS-REFERENCE TO RELATED APPLICATIONS

This application claims priority to U.S. Provisional Application No. 62/330,401, which was filed on 2 May 2016, and the entire disclosure of which is incorporated herein by reference.

BACKGROUND

Some light sources include phosphor bodies disposed on or near the light sources. These phosphor bodies, or phosphors, receive at least some of the light generated by the light sources. The received light causes the phosphors to emit light. For example, some light emitting diodes (LEDs) include red-emitting phosphors that receive light generated by the LEDs to emit light.

In order to create the phosphors, a potassium hexafluorosilicate (PFS)-based material can be blended with silicone. This blended mixture is then placed onto the LED and allowed to cure to form the phosphor. One problem that may arise in the blending of the PFS-based material with the silicone is the aggregation of the PFS-based material into larger clumps. For example, the PFS-based material may be in a powder form that is mixed with the silicone. During the mixing of the PFS-based powder into the silicone, the powder may aggregate into larger clumps. Electrostatic forces can cause this aggregation of the PFS-based powder.

These clumps can cause problems with the phosphors and forming the phosphors. The clumps of the PFS-based powder can reduce the amount of the PFS material that receives light from the light source, as only the outer surface area of the larger clumps may receive the light while the interior of the clumps may not receive the light. As a result, the amount of light received by the PFS material to generate light emitted from the phosphor that includes the PFS material is decreased (relative to a phosphor having no clumps or smaller aggregations of the PFS material). During formation of the phosphors, the PFS and silicone blend may be dispensed through a nozzle or other device having a relatively small opening. The clumps or other aggregations of the PFS material in the blend may clog or otherwise impede flow of the blend through and out of the nozzle onto the LED, thereby interfering with formation of the phosphors. Additionally, the larger clumps of the PFS-based powder can reduce the ability of the phosphor to dissipate heat (relative to a phosphor having no clumps or smaller clumps) and reduce the useful life span of the phosphor.

BRIEF DESCRIPTION

In one embodiment, a method includes obtaining a potassium hexafluorosilicate (PFS)-based powder, obtaining a fluidization material, and mixing the PFS-based powder with the fluidization material to form a PFS-based mixture. The PFS-based mixture is configured to be mixed with a resinous material to form a flowing phosphor blend configured to be placed onto a light source to form a phosphor on the light source.

In another embodiment, a method includes obtaining a potassium hexafluorosilicate (PFS)-based powder, obtaining a metal oxide fluidization material, and mixing the PFS-based powder with the metal oxide fluidization material to form a PFS-based mixture. The PFS-based mixture is configured to be mixed with a resinous material to form a phosphor blend that is configured to form a phosphor of a light source.

In one embodiment, a phosphor body is provided that is formed from a potassium hexafluorosilicate (PFS)-based powder, a metal oxide fluidization material, and a resinous material.

BRIEF DESCRIPTION OF THE DRAWINGS

The subject matter described herein will be better understood from reading the following description of non-limiting embodiments, with reference to the attached drawings, wherein below.

DETAILED DESCRIPTION

Figure 1:
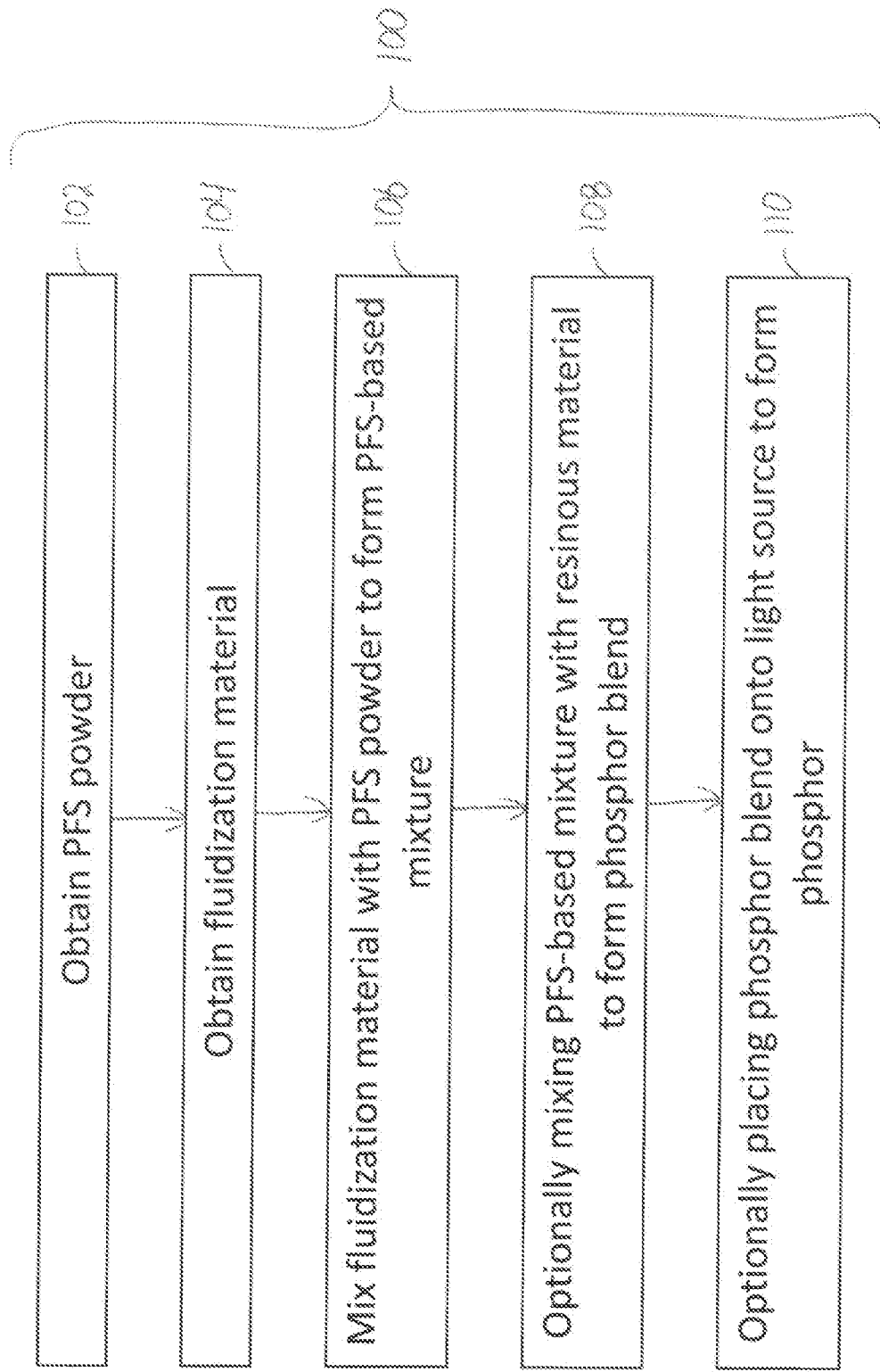
FIG. 1 illustrates a flowchart of one embodiment of a method for fluidizing phosphor materials and optionally for creating phosphors using fluidized phosphor materials.

FIG. 1 illustrates a flowchart of one embodiment of a method 100 for fluidizing phosphor materials and optionally for creating phosphors using fluidized phosphor materials. At 102, a PFS-based powder is obtained. The PFS-based powder can be potassium hexafluorosilicate that is doped with tetravalent manganese ($Mn^{4+}$). Alternatively, another type of phosphor material may be obtained. The PFS-based material may be in the form of a powder when the PFS-based material is obtained by disintegrating a larger solid body of the PFS-based material, such as by grinding or crushing the larger solid body. In one embodiment, the PFS-based material may be in the form of a powder when the PFS-based material has an average or median of the largest outside non-circumferential dimension or diameter that is no greater than one tenth of a millimeter.

At 104, a fluidization material is obtained. The fluidization material includes a metal oxide powder in one embodiment. For example, the fluidization material may include aluminum oxide. Alternatively, the fluidization material may include another metal oxide powder or a material such as silica or fumed silica. The fluidization material may be provided in a powder when the particles of the fluidization material have a very small size, such as an average or median of the largest outside non-circumferential dimension or diameter that is smaller than one micron.

Figure 2:
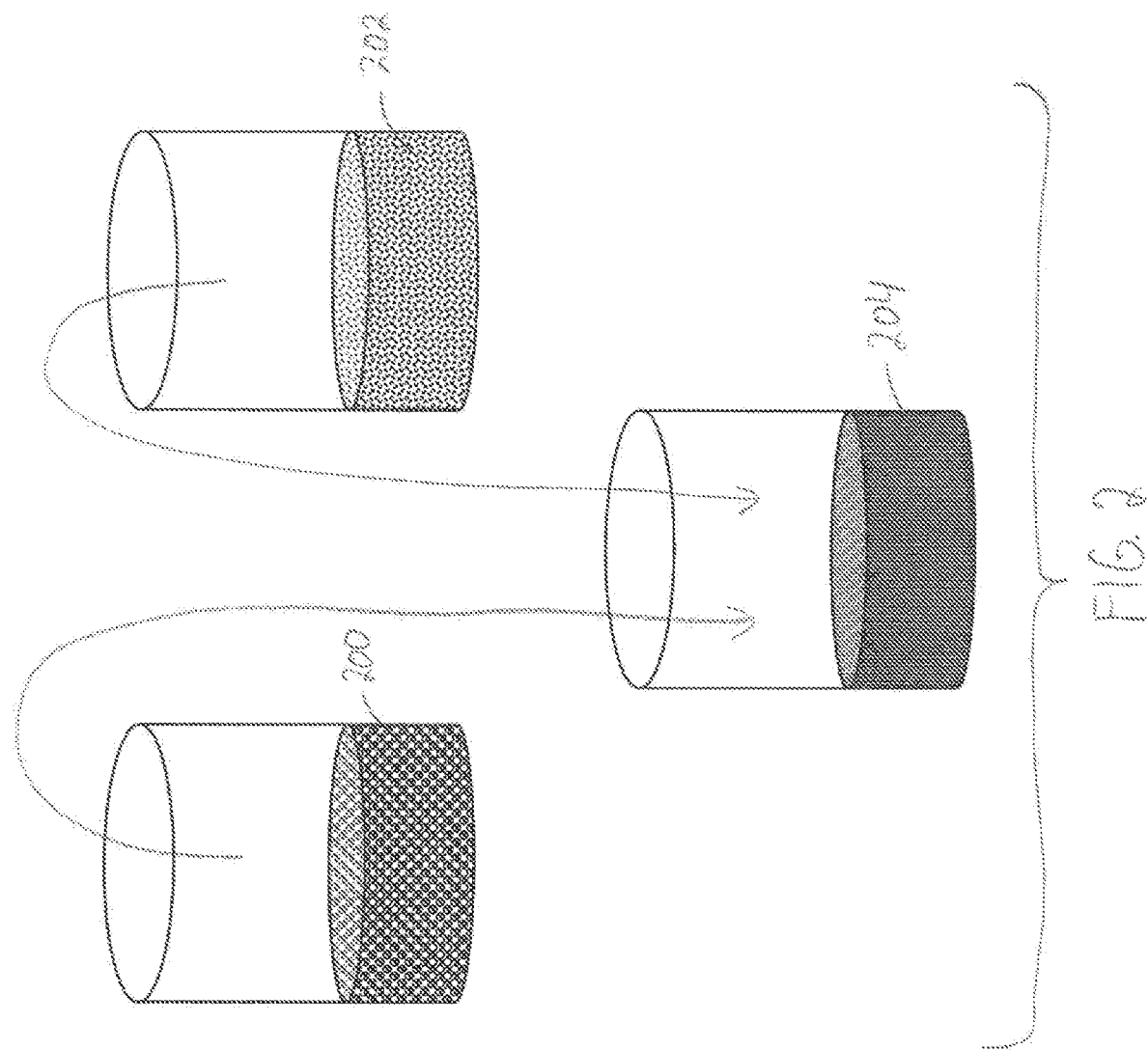
FIG. 2 illustrates mixing of a PFS-based material with a fluidization material to form a fluidized PFS-based mixture according to one embodiment.

At 106, the fluidization material is mixed with the PFS-based powder to form a PFS-based mixture. FIG. 2 illustrates mixing of a PFS-based material 200 with a fluidization material 202 to form a fluidized PFS-based mixture 204 according to one embodiment. The amount of the fluidization material 202 that is mixed into the PFS-based material 200 may be relatively small. For example, the total weight of the fluidization material 202 that is mixed with the PFS-based material 200 may be no more than 0.1% of the weight of the PFS-based material 200. Alternatively, the total weight of the fluidization material 202 that is mixed with the PFS-based material 200 may be no more than 0.08%, no more than 0.06%, no more than 0.05%, no more than 0.04%, no more than 0.03%, or no more than 0.02% of the weight of the PFS-based material 200.

Figure 3:
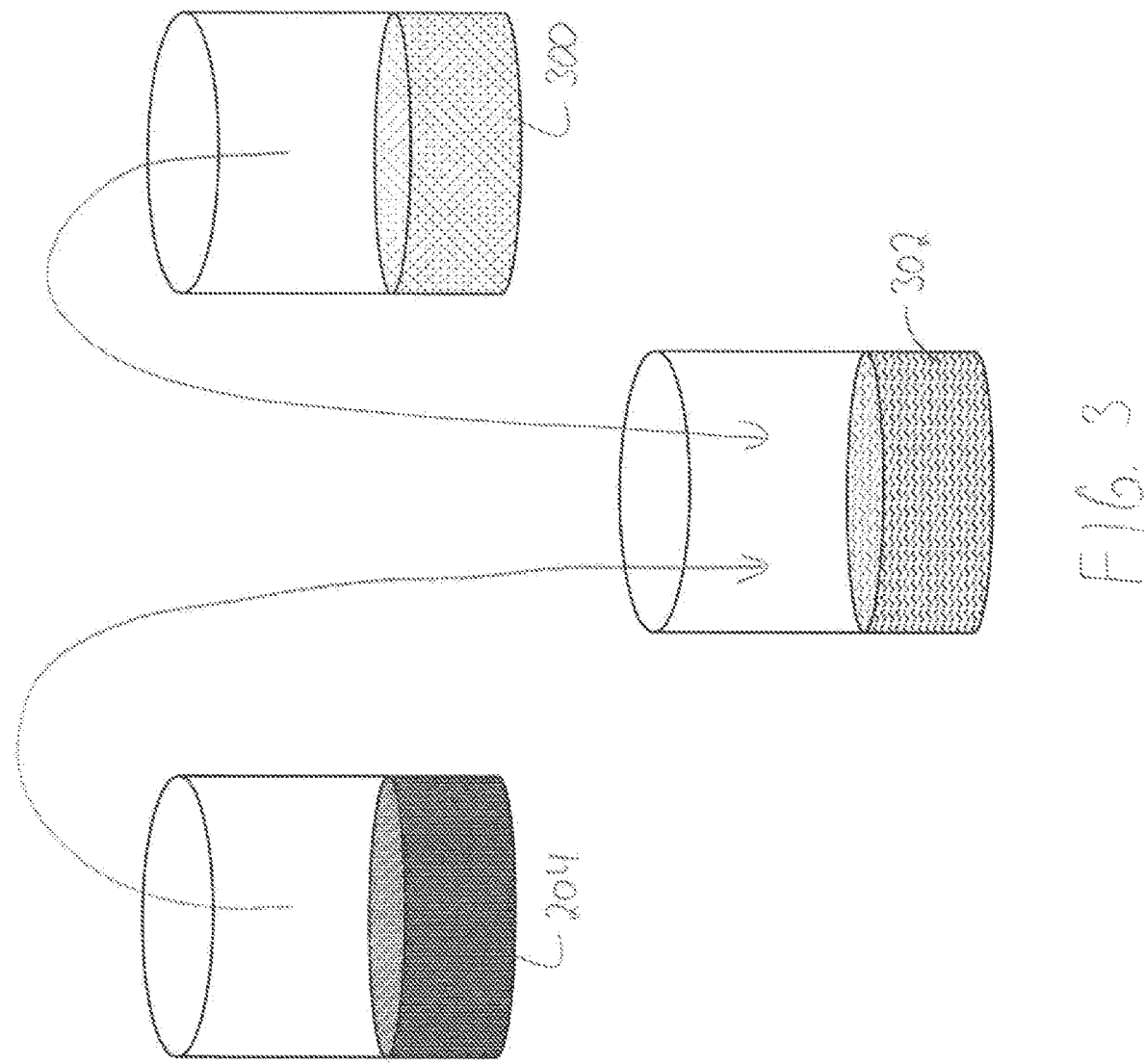
FIG. 3 illustrates mixing of the fluidized PFS-based mixture shown in FIG. 2 with a resinous material according to one embodiment.

The method 100 optionally includes mixing the fluidized PFS-based mixture 204 with a resinous material at 108. FIG. 3 illustrates mixing of the fluidized PFS-based mixture 204 shown in FIG. 2 with a resinous material 300 according to one embodiment. The fluidized mixture 204 and the resinous material 300 are combined to form a flowing phosphor blend 302. The blend 302 may flow by being at least partially fluid until the blend 302 cures into a solid body. In one embodiment, the resinous material 300 is silicone, such as polydimethylsiloxane. Alternatively, another curable resinous material may be used.

Figure 4:
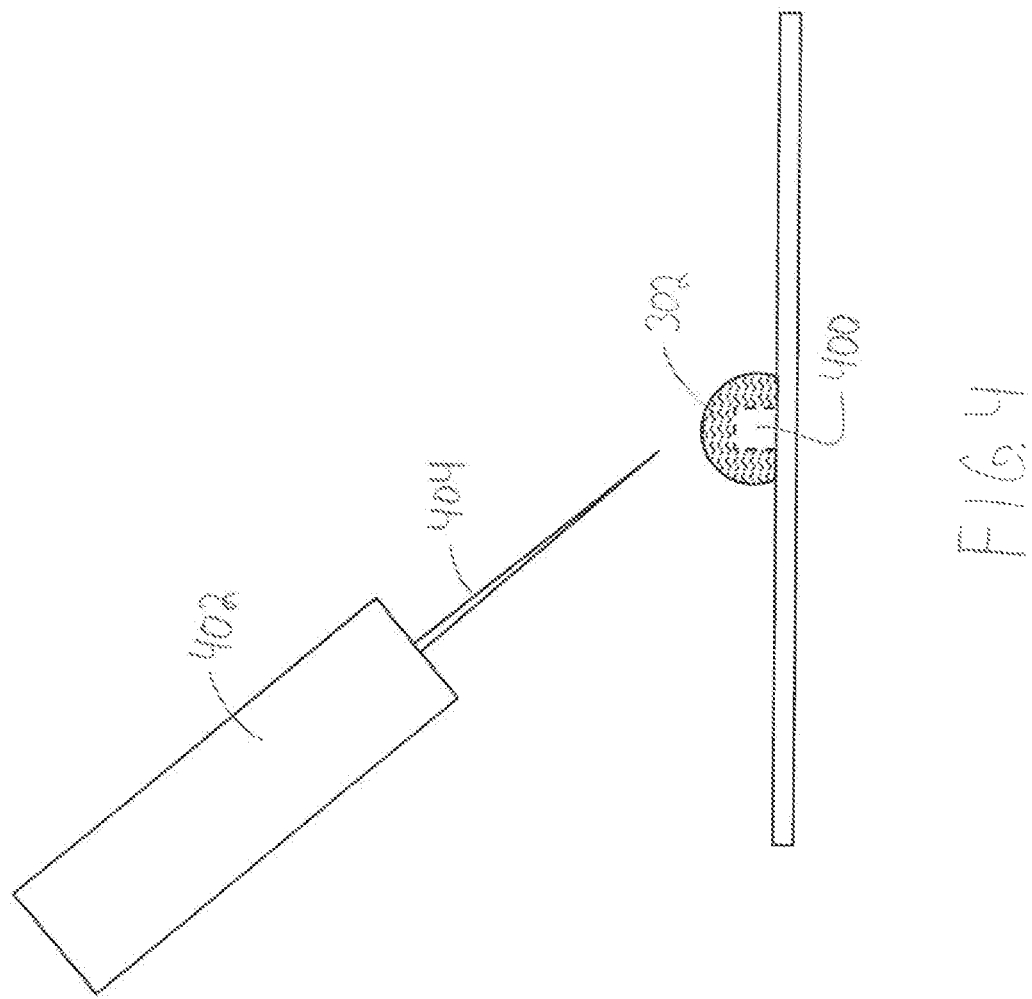
FIG. 4 illustrates placing a phosphor blend shown in FIG. 3 onto a light source according to one embodiment.

The method 100 optionally includes placing the phosphor blend onto a light source at 110. FIG. 4 illustrates placing the phosphor blend 302 onto a light source 400 according to one embodiment. The phosphor blend 302 may be injected onto the light source 400, such as a semiconductor-based light source (e.g., an LED), by injecting the blend 302 from a reservoir 402 through a nozzle 404 and onto the light source 400. Optionally, the blend 302 may be sprayed or otherwise dispensed from the nozzle 404. As shown in FIG. 4, the blend 302 may at least partially encapsulate the light source 400. The blend 302 may then be cured to harden on or over the light source 400. The cured blend 302 forms the phosphor or phosphor body on the light source 400 that emits light responsive to receiving light generated by the light source 400.

The nozzle 404 may have a relatively small outlet or orifice through which the blend 302 exits the nozzle 404. The outlet may have a diameter of 70 microns or smaller. Without adding the fluidization material 202 to the PFS-based material 200, particles of the PFS-based material 200 in the blend 302 may clog the outlet of the nozzle 404 and prevent additional blend 302 from being dispensed from the nozzle 404. Addition of the fluidization material 202 to the PFS-based material 200 prevents this clogging from occurring.

Figure 5:
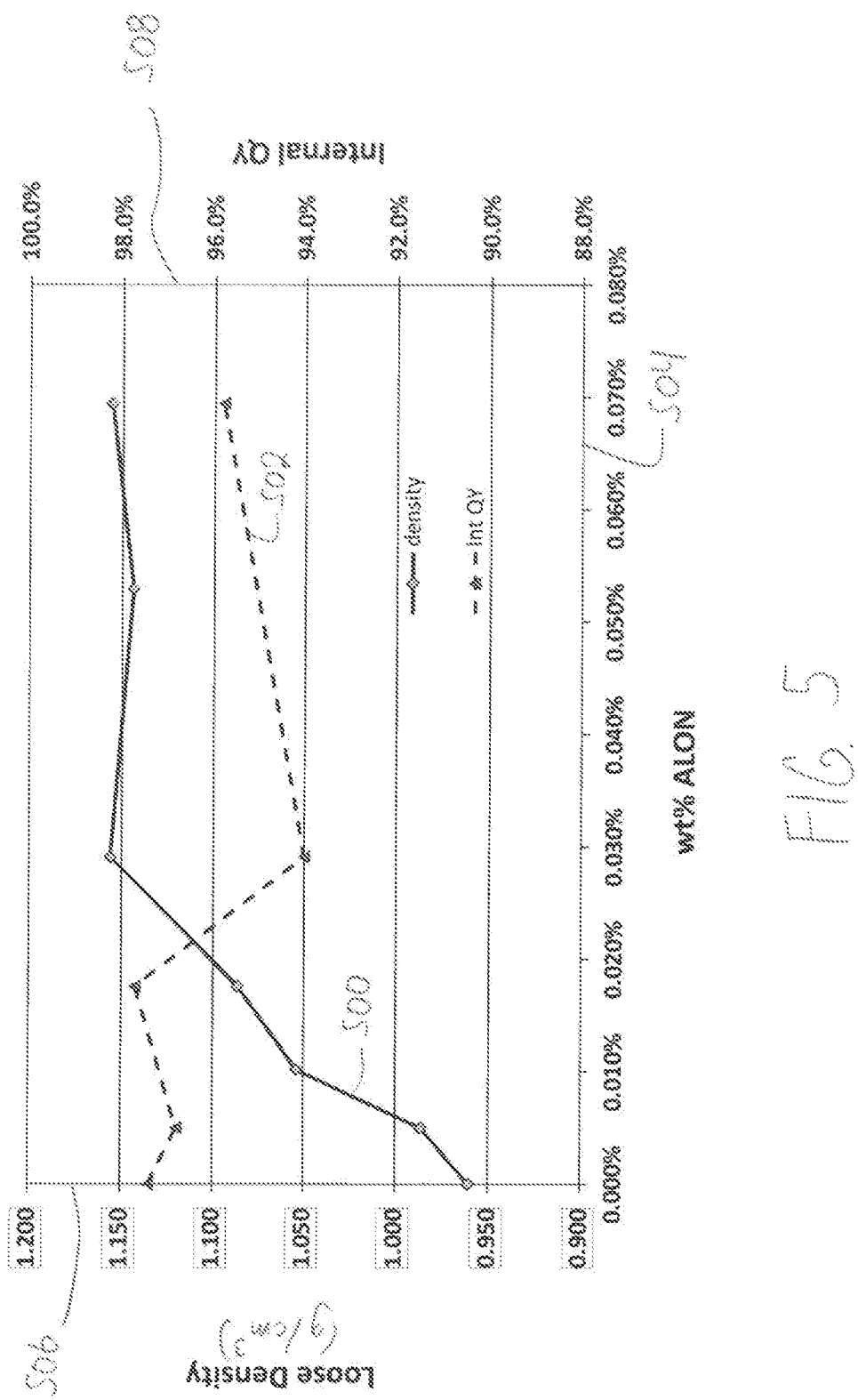
FIG. 5 illustrates loose densities of the PFS-based mixture shown in FIG. 2 and internal quantum yields or quantum efficiencies (QY) of the PFS-based mixture for different weight percentages of fluidization material in the PFS-based mixture.

The addition of the fluidization material 202 to the PFS-based material 200 can increase the loose density or bulk density of the of the fluidized PFS-based mixture 204, even at relatively small amounts of the fluidization material 202. FIG. 5 illustrates loose densities 500 of the PFS-based material 200 in the PFS-based mixture 204 and internal quantum yields or quantum efficiencies (QY) 502 of the PFS-based mixture 204 for different weight percentages of fluidization material 202 in the mixture 204. The internal quantum yields or efficiencies may represent a ratio of the number of photons exiting a sample of the PFS-based mixture to the number of photons that are absorbed by the sample. The internal quantum yields or efficiencies may be measured by the FS5 spectrofluorometer with integrating sphere produced by Edinburgh Instruments. In the examples shown in FIG. 5, the PFS-based material 200 is potassium hexafluorosilicate doped with tetravalent manganese and the fluidization material 202 is aluminum oxide.

The loose densities 500 and the quantum yields 502 are shown alongside a horizontal axis 504 representative of different weight percentages of the aluminum oxide in the mixture 204 and alongside a first vertical axis 506 representative of different loose densities and alongside a second vertical axis 508 representative of different internal quantum yields or efficiencies.

As shown in FIG. 5, addition of the fluidization material 202 to the PFS-based material 200 increases the loose density 500 of the PFS-based material 200 even at relatively low amounts (e.g., at 0.005% weight percentage). As the amount of the fluidization material 202 added to the PFS-based mixture 204 increases (e.g., amounts of 0.03% to 0.07% weight percentage), the loose density 500 becomes constant or substantially constant and is about 20% greater than the loose density 500 with no fluidization material 202 added to the PFS-based material 200. The quantum efficiency 502 of the PFS-based mixture 204 over this range is, within measurement error of powders, is constant or substantially constant.

Unless defined otherwise, technical and scientific terms used herein have the same meaning as is commonly understood by one having ordinary skill in the art to which this disclosure belongs. The terms "first", "second", and the like, as used herein, do not denote any order, quantity, or importance, but rather are employed to distinguish one element from another. Also, the terms "a" and "an" do not denote a limitation of quantity, but rather denote the presence of at least one of the referenced items. The use of "including," "comprising" or "having" and variations thereof herein, are meant to encompass the items listed thereafter and equivalents thereof, as well as additional items. The terms "connected" and "coupled" are not restricted to physical or mechanical connections or couplings, and can include electrical and optical connections or couplings, whether direct or indirect.

Furthermore, the skilled artisan will recognize the interchangeability of various features from different embodiments. The various features described, as well as other known equivalents for each feature, can be mixed and matched by one of ordinary skill in this art, to construct additional systems and techniques in accordance with principles of this disclosure.

In describing alternate embodiments of the apparatus claimed, specific terminology is employed for the sake of clarity. The invention, however, is not intended to be limited to the specific terminology so selected. Thus, it is to be understood that each specific element includes all technical equivalents that operate in a similar manner to accomplish similar functions.

It is noted that various non-limiting embodiments, described and claimed herein, may be used separately, combined, or selectively combined for specific applications.

Further, some of the various features of the above non-limiting embodiments may be used to advantage, without the corresponding use of other described features. The foregoing description should therefore be considered as merely illustrative of the principles, teachings and exemplary embodiments of this invention, and not in limitation thereof.

The limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A phosphor body formed from:
a potassium hexafluorosilicate-based powder, wherein the potassium hexafluorosilicate-based powder comprises potassium hexafluorosilicate doped with manganese;

a fumed silica fluidization material, wherein the fumed silica fluidization material is present in an amount less than or equal to 0.1 wt % relative to a weight of the potassium hexafluorosilicate-based powder; and a resinous material.

2. The phosphor body of claim 1, wherein the manganese comprises $Mn^{4+}$.

3. The phosphor body of claim 1, wherein the fluidization material is formed as sub-micron sized particles.

4. The phosphor body of claim 1, wherein the resinous material includes silicone.

5. The phosphor body of claim 1, wherein the phosphor body has a greater quantum efficiency relative to another phosphor body formed from a phosphor blend that includes the potassium hexafluorosilicate-based powder and the resinous material and that does not include the fluidization material.

6. A phosphor body formed from:

a potassium hexafluorosilicate-based powder, wherein the potassium hexafluorosilicate-based powder comprises potassium hexafluorosilicate doped with $Mn^{4+}$;

a metal oxide fluidization material, wherein the fluidization material is formed as sub-micron sized particles, and wherein the metal oxide fluidization material is present in an amount less than or equal to 0.1 wt % relative to a weight of the potassium hexafluorosilicate-based powder; and a resinous material.

7. The phosphor body of claim 6, wherein the metal oxide fluidization material comprises alumina.

8. The phosphor body of claim 6, wherein the particles of the metal oxide fluidization material have an average or median diameter less than one micrometer.

9. The phosphor body of claim 6, wherein the metal oxide fluidization material is present in an amount of 0.03 wt % to 0.07 wt % relative to weight of the potassium hexafluorosilicate-based powder.

10. The phosphor body of claim 6, said body at least partially encapsulating a light source.

11. The phosphor body of claim 6, wherein addition of the metal oxide fluidization material to the potassium hexafluorosilicate-based powder increases the loose density of a mixture of the potassium hexafluorosilicate-based powder and the metal oxide fluidization material, relative to absence of the metal oxide fluidization material.

12. The phosphor body of claim 6, formed by a method comprising the steps of:

mixing a potassium hexafluorosilicate-based powder with a metal oxide fluidization material to form a potassium hexafluorosilicate-based mixture, mixing the potassium hexafluorosilicate-based mixture with a resinous material to form a flowing phosphor blend; and curing or hardening the flowing phosphor blend to form the phosphor body.

13. A phosphor body formed from:

a potassium hexafluorosilicate-based powder, aluminum oxide powder, and a resinous material, wherein the aluminum oxide powder is present in an amount less than or equal to 0.1 wt % relative to a weight of the potassium hexafluorosilicate-based powder;

wherein said body at least partially encapsulating a light source.

14. The phosphor body of claim 13, wherein particles of the aluminum oxide powder have an average or median diameter less than one micrometer.

15. The phosphor body of claim 13, wherein the aluminum oxide powder is present in an amount of 0.03 wt % to 0.07 wt % relative to weight of the potassium hexafluorosilicate-based powder.

* * * * *